United States Patent [19]

Kawashima

[11] 4,178,566

[45] Dec. 11, 1979

[54] QUARTZ CRYSTAL TUNING FORK VIBRATOR FOR A CRYSTAL OSCILLATOR

[75] Inventor: Hirofumi Kawashima, Tokyo, Japan

[73] Assignee: Kabushiki Kaisha Daini Seikosha, Japan

[21] Appl. No.: 922,435

[22] Filed: Jul. 6, 1978

Related U.S. Application Data

[63] Continuation-in-part of Ser. No. 751,336, Dec. 16, 1976, abandoned.

[30] Foreign Application Priority Data

Dec. 19, 1975 [JP] Japan .............................. 50-151670

[51] Int. Cl.² .................... H03B 5/36; H03H 9/18; H03H 9/20
[52] U.S. Cl. .................................. 331/156; 310/361; 310/365; 310/366; 310/370; 331/163
[58] Field of Search ............... 310/370, 361, 365, 366; 331/116 R, 116 FE, 163, 156; 58/23 R, 23 AC, 23 TF

[56] References Cited

U.S. PATENT DOCUMENTS

| | | | |
|---|---|---|---|
| 3,617,923 | 11/1971 | Paradysz et al. | 331/116 R X |
| 3,714,867 | 2/1973 | Dargent | 331/116 R X |
| 3,969,641 | 7/1976 | Oguchi et al. | 310/370 X |
| 3,979,698 | 9/1976 | Gollinger | 331/116 R |

*Primary Examiner*—Siegfried H. Grimm
*Attorney, Agent, or Firm*—Robert E. Burns; Emmanuel J. Lobato; Bruce L. Adams

[57] ABSTRACT

An oscillator circuit including a flexural quartz crystal vibrator of the tuning fork type having an electromechanical coupling factor within the range of 2.5% to 3.5%. The vibrator is comprised of a quartz crystal element including a base portion and a pair of vibratable legs extending therefrom, and a pair of electrodes disposed on the quartz element for receiving alternating electrical signals of opposite polarity for effecting flexural vibration of the legs in response to the electrical signals. The quartz element is defined by a cutting angle within the range of zytw (0°–10°)/(10°–30°).

9 Claims, 4 Drawing Figures

QUARTZ CRYSTAL TUNING FORK VIBRATOR FOR A CRYSTAL OSCILLATOR

CROSS-REFERENCE TO RELATED APPLICATION

This application is a continuation-in-part application of prior copending application Ser. No. 751,336, filed Dec. 16, 1976 and now abandoned.

BACKGROUND OF THE INVENTION

This invention relates to a quartz crystal oscillator circuit, and particularly to an oscillator circuit for use in an electronic wrist watch and which includes a flexural quartz crystal vibrator of the tuning fork type.

Modern electronic wrist watches employ oscillator circuits which includes a quartz crystal vibrator as a frequency standard. In particular, these electronic wrist watches use flexural quartz crystal vibrators of the tuning fork type, and as a result it is possible to realize a highly accurate wrist watch. Because of this high accuracy time correction is very infrequently required so that it is greatly desired that such wrist watches have a long battery life in order to provide a wrist watch requiring substantially no servicing for very long periods of time.

Generally, a quartz crystal vibrator of the tuning fork type is designed so that the electromechanical coupling factor k thereof is maximized. The electromechanical coupling factor of a conventional flexural quartz crystal vibrator of the tuning fork type is about 4% at maximum efficiency. If one tries to obtain a stable frequency in an oscillator circuit using a quartz crystal vibrator of the tuning fork type having a high electro-mechanical coupling factor k of about 4%, the resultant electrical current consumption of the circuit will be high because the high electromechanical coupling factor k of the quartz crystal vibrator requires a large load capacitance to insure frequency stability. Therefore, in the conventional oscillator circuit it is impossible to have both long battery life and high frequency stability in an electronic wrist watch.

SUMMARY OF THE INVENTION

Accordingly, it is an object of the present invention to provide an improved oscillator circuit suitable for use in an electronic timepiece and including a flexural quartz crystal vibrator that exhibits high frequency stability.

It is another object of the present invention to provide an oscillator circuit suitable for use in an electronic timepiece and including a flexural quartz crystal vibrator and which exhibits low current consumption.

It is another object of the invention to provide a flexural quartz crystal vibrator suitable for use in an electronic timepiece oscillator circuit which will exhibit a high degree of frequency stability.

It is still another object of the present invention to provide a flexural quartz crystal vibrator of the tuning fork type suitable for use in an electronic timepiece oscillator circuit which will exhibit low current consumption.

The applicant has discovered an interrelationship among the electromechanical coupling factor k of a quartz crystal vibrator, the frequency stability of an oscillator circuit incorporating the quartz crystal vibrator, the value of a loading capacitor in the oscillator circuit and to which the quartz crystal vibrator is connected and the electrical current consumption of the oscillator circuit. The applicant has further discovered a relationship between cutting angles of a quartz crystal element comprising the quartz crystal vibrator and the resultant electromechanical coupling factor k of the quartz crystal vibrator. As a consequence, it is possible to realize an oscillator circuit in an electronic wrist watch that has a very low electrical current consumption and which exhibits high frequency stability, by utilizing a flexural quartz crystal vibrator according to the present invention. In accordance with the invention, an oscillator circuit includes a flexural quartz crystal vibrator of the tuning fork type having an electromechanical coupling factor within the range of 2.5% to 3.5%. A variable load capacitor of the oscillator circuit is connected to the quartz crystal vibrator for setting a frequency of vibration of the quartz crystal vibrator. The variable load capacitor has a range of values from 3 pF to 35 pF. A cutting angle of the flexural quartz crystal vibrator is within the range of zytw (0°–10°)/(1-0°–30°).

The quartz crystal vibrator is comprised of a plate-like quartz crystal element having a pair of opposed flat major surfaces and including a base portion and a pair of vibratable legs extending from the base portion. The quartz crystal vibrator has an elctromechanical coupling factor within the range of 2.5% to 3.5%. The vibrator further comprises a pair of electrodes disposed on one of the flat major surfaces and each having respective parallel straight portions extending along the length direction of each of the vibratable legs. The pair of electrodes receive alternating electrical signals of opposite polarity for effecting flexural vibration of the legs in response to the alternating electrical signals applied to the pair of electrodes. The plate-like quartz crystal element is defined by a cutting angle within the range of zytw (0°–10°)/(10°–30°).

In a preferred embodiment the flexural quartz crystal vibrator has a pair of vibratable legs each having a length on the order of 2.5 mm, a width on the order of 0.25 mm and a thickness on the order of 0.05 mm. The cutting angle is on the order of zytw 0°/11°. The pair of electrodes are comprised of a first electrode disposed in a pattern extending from the base portion along the length direction of a first vibratable leg for substantially the entire length of the first leg to a free end of the first leg remote from the base portion, back from the free end of the first leg along the length direction thereof to the base portion, across the base portion to a second vibratable leg and along a length direction of the second leg for substantially the entire length of the second leg and terminating at a free end of the second leg remote from the base portion. The pair of electrodes further comprise a second electrode disposed in a pattern extending from the free end of the first leg along the length direction thereof between the first electrode to the base portion, across the base portion to the second leg, along the length direction of the second leg along the first electrode to the free end of the second leg and back along the second leg on the other side of the first electrode for a substantial portion of a length of the second leg. In a preferred embodiment the quartz crystal vibrator further comprises a second pair of electrodes disposed on a second major surface of the quartz crystal element and identical to the first-mentioned pair of electrodes previously described.

BRIEF DESCRIPTION OF THE DRAWINGS

These and other objects, features and advantages of the invention set forth in the appended claims will be more apparent upon a reading of the following detailed description of the invention and drawings, wherein:

DESCRIPTION OF THE PREFERRED EMBODIMENT

Figure 1:
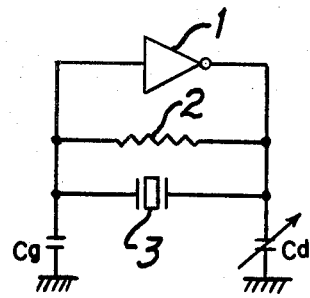
FIG. 1 illustrates an oscillator circuit including a flexural quartz vibrator in accordance with the present invention.

FIG. 1 illustrates a quartz crystal oscillator circuit in accordance with the present invention, in which a C-MOS IC inverter 1 is connected in parallel with a feedback resistor 2 and a flexural quartz crystal vibrator of a tuning fork type 3 according to the present invention. The fundamental frequency of the quartz crystal vibrator is 32,768 Hz. The load capacitors Cg and Cd are respectively connected to a gate side and a drain side of the C-MOS IC. The load capacitor Cg is a fixed capacitor and the load capacitor Cd is a variable capacitor. A source voltage of 1.57 V for driving the flexural quartz crystal vibrator of the tuning fork type is usually employed.

Figure 2:
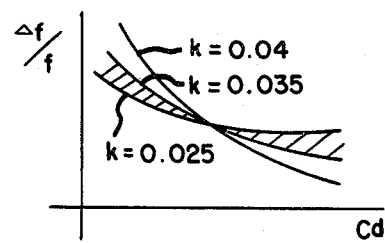
FIG. 2 illustrates the load capacitance-frequency variation characteristics of a flexural quartz crystal vibrator having an electromechanical coupling factor of a conventional value and an electromechanical coupling factor within the range according to the present invention.

FIG. 2 illustrates the relationship between the resonant frequency variation ($\Delta f/f$) and the load capacitance (Cd) for an arbitrary value of Cg in FIG. 1. FIG. 2 shows that the frequency variation ($\Delta f/f$)—variable load capacitance (Cd) curve is changed for different values of the electromechanical coupling factor k of the flexural quartz crystal vibrator of the tuning fork type. If the electromechanical coupling factor k of the flexural quartz crystal vibrator of the tuning fork type is large, which is about 4%, the frequency variation ($\Delta f/f$)—variable load capacitance (Cd) curve is sharp and decreases with increasing variable load capacitance (Cd). But if the electromechanical coupling factor k of the quartz crystal vibrator is small, which is about 2.5%, the frequency variation ($\Delta f/f$)—variable load capacitance Cd curve is fairly flat but decreasing with increasing variable load capacitance (Cd). This means that the larger the variable load capacitance Cd becomes, the smaller the frequency variation per pF of load capacitance becomes.

If there is no change in the values of the load capacitors Cg and Cd with time, it is fully possible to obtain a stable frequency of the quartz crystal oscillating circuit, as though the frequency variation ($\Delta f/f$)—variable load capacitance (Cd) curve is sharp. But in practice changes of the load capacitors Cg and Cd with time are large. Therefore, if the frequency variation ($\Delta f/f$)—variable load capacitance curve is large, the frequency variation with time in the quartz crystal oscillating circuit becomes large and the resultant frequency stability characteristics are not suitable for a wrist watch. In order to maintain the frequency stability, it is required that the frequency variation—load capacitance curve should be flat and low within the range of the load capacitance used. When the electromechanical coupling factor k in FIG. 2 is about 4% in accordance with the conventional flexural quartz crystal vibrator of the tuning fork type, it is necessary that the variable load capacitance should be within the range of 35 pF to 50 pF for a value Cg=25 pF so that the frequency variation ($\Delta f/f$)—load capacitance curve is flat and low.

Because a large value load capacitor Cd is employed, the electrical current consumption is high. This is because the current consumption is proportional to the load capacitance Cd. Consequently, to minimize electrical current consumption the value of the load capacitance Cd should be as small as possible. As shown in FIG. 2, the present invention utilizes the discovery that the frequency variation ($\Delta f/f$)—load capcitance curve changes with a change of the electromechanical coupling factor k. According to the present invention the electromechanical coupling factor k must be in the range of 2.5%–3.5%, in order to use the load capacitance Cd within the range of 5 pF to 35 pF, and the frequency stability of the quartz crystal oscillator circuit will be maintained.

It is substantially possible to employ a load capacitance Cd less than 5 pF so as to further reduce the electrical current consumption. But there is a lower limit to the load capacitance Cd because the second harmonic frequency of the flexural quartz crystal vibrator of the tuning fork type which is about 180 KHz is strongly excited, instead of the fundamental frequency of 32,768 Hz being excited, when the load capacitance becomes less than 5 pF.

Figure 3:
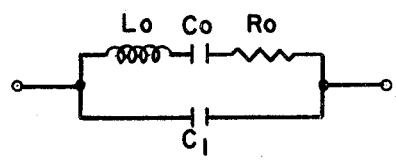
FIG. 3 illustrates an elecrical equivalent circuit of the flexural quartz crystal vibrator of the tuning fork type according to the present invention.

FIG. 3 illustrates the electrical equivalent circuit of the flexural quartz crystal vibrator of the tuning fork type, in which the symbols $L_0$, $C_0$, $R_0$ and $C_1$ represent motional inductance, motional capacitance, series resistance and shunt capacitance, respectively. The electromechanical coupling factor k is expressed as follows:

$$k^2 = (\pi^2/8) \cdot (1/r) \text{ (where } r = C_1/C_0) \ldots \quad (1)$$

In order that the electromechanical coupling factor k becomes less than the conventional value, it is natural that the capacitance ratio r should be large, as shown by equation (1).

Moreover, as the electromechanical coupling factor k is proportional to the value d′, which is a function of the $d_{11}$ and $d_{14}$ constants of quartz, in the direction of width of the flexural quartz crystal vibrator of the tuning fork type and inversely proportional to the value $S'^{\frac{1}{2}}$, which is also a function of the $S_{11}$, $S_{13}$, $S_{14}$, $S_{33}$ and $S_{44}$ constants of quartz, these relations are expressed as follows:

$$k \alpha d'/S'^{\frac{1}{2}} \ldots \quad (2)$$

That is to say, the electromechanical coupling factor k of the flexural quartz crystal vibrator of the tuning fork type can be determined by selecting the values d′ and S′.

Figure 4:
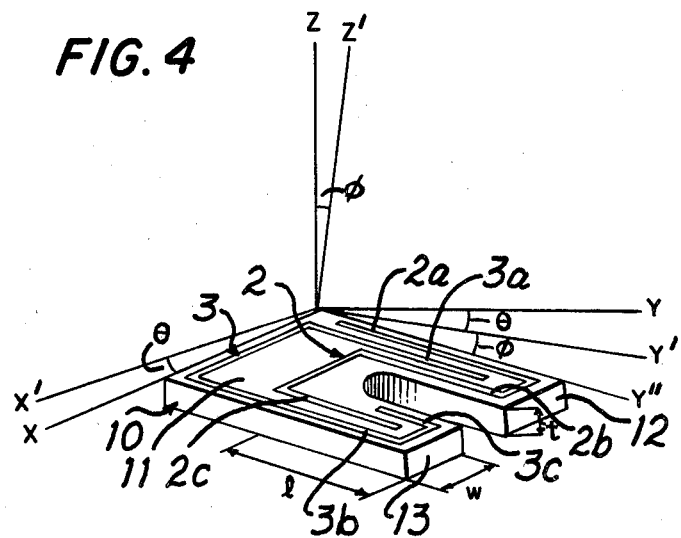
FIG. 4 is a perspective view of a flexural quartz crystal vibrator of the tuning fork type according to the present invention.

FIG. 4 illustrates the structure, electrode arrangement and cutting angle of the flexural quartz crystal vibrator of the tuning fork type in accordance with the present invention. The quartz crystal vibrator of the tuning fork type is comprised of a plate-like quartz element 10 having a pair of opposed flat major surfaces and including a base portion 11 and a pair of vibratable legs 12, 13 extending from the base portion 11. On one of the major surfaces a first conductive film electrode 2 and a second conductive film electrode 3 are disposed, and on the reverse or opposite major surface a second pair of electrodes identical to the first are also disposed (not shown in FIG. 4).

The first electrode 2 is disposed in a pattern having a portion 2a extending from the base portion 11 along the length direction of the first vibratable leg 12 for substantially the entire length of the first leg 12 to a free end of the first leg 12 remote from the base portion 11, a portion 2b extending back from the free end of the first leg 12 along the length direction thereof to the base portion 11, a portion extending across the base portion 11 to a second vibratable leg 13 and a portion 2c extending along a length direction of the second leg 13 for substantially the entire length of the second leg 13 and terminating at a free end of the second leg 13 remote from the base portion 11. A second electrode 3 is disposed in a pattern having a portion 3a extending from the free end of the first leg 12 along the length direction thereof and between portions 2a, 2b of the first electrode 2 to the base portion 11, a portion extending across the base portion 11 to the second leg 13, a portion 3b extending along the length direction of the second leg 3 to the free end of the second leg 13 and a portion 3c extending back along the second leg 13 on the other side of the portion 2c of the first electrode 2 for a substantial portion of the length of the second leg 13. The width of the electrodes is not critical. The flexural quartz crystal vibrator of the tuning fork type is excited by applying alternating voltages of opposite polarity to the electrode 2 and electrode 3.

The cutting angle of the flexural quartz crystal vibrator is expressed by zytw ($\theta/\phi$) when the flexural quartz crystal vibrator legs 12, 13 have thickness dimension t, length dimension l, and width dimension w. And then, the values d' and S' are a function of the cutting angles $\theta$, $\phi$, as follows:

$$d' = d_{11}(l_1 l_2^2 - l_1 m_2^2 - 2m_1 l_2 m_2) + d_{14}(l_1 m_2 n_2 - m_1 l_2 n_2) \quad (3)$$
$$S' = S_{11}(l_2^2 + m_2^2)^2 + 2S_{13} n_2^2 (l_2^2 + m_2^2) + 2S_{14} m_2 n_2 (3l_2^2 - m_2^2) + S_{22} n_2^4 + S_{44} n_2^2 (l_2^2 + m_2^2) \quad (4)$$

where $d_{11}$ and $d_{14}$ are the piezoelectric constants of quartz, respectively;

$S_{11}$, $S_{13}$, $S_{14}$, $S_{33}$ and $S_{44}$ are the elastic compliance constants of quartz, respectively;

$l_1 = \cos \theta$
$m_1 = \sin \theta$
$l_2 = -\cos \phi \cdot \sin \theta$
$m_2 = \cos \phi \cos \theta$
$n_2 = \sin \phi$.

It has been experimentally determined that in the present invention the cutting angles $\theta$ and $\phi$ must be in the ranges of 0°–10° and 10°–30° (zytw(0°–10°)/(10°–30°)), respectively, so as to obtain the electromechanical coupling factor k within the range of 2.5%–3.5%.

EXAMPLE

In an embodiment of the present invention wherein the length l, thickness t, width w, cutting angles $\theta$ and $\phi$ have values of 2.5 mm, 0.05 mm, 0.25 mm, 0°, and 11° respectively, the motional capacitance $C_0$ and the shunt capacitance $C_1$ have respective values $0.44 \times 10^{-3}$ pF and 0.5 pF in the electrical equivalent circuit shown in FIG. 3. In the present invention these parameters yield an electromechanical coupling factor k which is about 3.3% which is determined using equation (1).

It has been shown that the present invention is capable of providing an improved flexural quartz crystal vibrator of the tuning fork type having an electromechanical coupling factor k within the range of 2.5% to 3.5%, by selecting a suitable cutting angle of the vibrator. Therefore, the present invention is capable of providing the quartz crystal oscillator circuit in which the electrical current consumption is extremely small, and the frequency stability of the circuit is good. Accordingly, an accurate electronic wrist watch having a long life battery can be obtained, so that the present invention results in a substantial improvement.

What I claim is:

1. In an oscillator circuit, a flexural quartz crystal vibrator of the tuning fork type having an electromechanical coupling factor within the range of 2.5% to 3.5%.

2. In an oscillator circuit according to claim 1, a variable load capacitor connected to said quartz crystal vibrator for setting a frequency of vibration of said quartz crystal vibrator.

3. In an oscillator circuit according to claim 2, wherein said variable load capacitor has a range of values from 5 pF to 35 pF.

4. In an oscillator circuit according to claim 1, wherein a cutting angle of said flexural quartz crystal vibrator is within the range of zytw (0°–10°)/(10°–30°).

5. A flexural quartz crystal vibrator comprising: a plate-like quartz crystal element having a pair of opposed flat major surfaces and including a base portion and a pair of vibratable legs extending from the base portion, wherein the quartz crystal vibrator has an electromechanical coupling factor within the range of 2.5% to 3.5%; and a pair of electrodes disposed on one of the flat major surfaces and each having respective parallel straight portions extending along the length direction of each of said vibratable legs for receiving alternating electrical signals of opposite polarity for effecting flexural vibration of said legs in response to the alternating electrical signals applied to said pair of electrodes.

6. A flexural quartz crystal vibrator according to claim 5, wherein said plate-like quartz crystal element is defined by a cutting angle within the range of zytw (0°–10°)/(10°–30°).

7. A flexural quartz crystal vibrator according to claim 6, wherein said quartz crystal element has a pair of vibratable legs each having a length on the order of 2.5 mm, a width on the order of 0.25 mm and a thickness on the order of 0.05 mm, and wherein the cutting angle is on the order of zytw 0°/11°.

8. A flexural quartz crystal vibrator according to claim 6, wherein said pair of electrodes is comprised of: a first electrode disposed in a pattern extending from said base portion along a length direction of a first vibratable leg for substantially the entire length of said first leg to a free end of said first leg remote from said base portion, back from said free end of said first leg along the length direction thereof to said base portion, across said base portion to a second vibratable leg and along a length direction of said second leg for substantially the entire length of said second leg and terminating at a free end of said second leg remote from said base portion; and a second electrode disposed in a pattern extending from said free end of said first leg along the length direction thereof and between said first electrode to said base portion, across said base portion to said second leg, along the length direction of said second leg along said first electrode to said free end of said second leg and back along said second leg on the other side of said first electrode for a substantial portion of the length of said second leg.

9. A flexural quartz crystal vibrator according to claim 8, further comprising a second pair of electrodes disposed on a second major surface of said quartz crystal element and identical to the first-mentioned pair of electrodes set forth in claim 8.

* * * * *